May 23, 1961 W. D. JOHNSTON 2,985,700

TITANATE THERMOELECTRIC MATERIALS

Filed June 10, 1959

WITNESSES

John E. Heasley Jr.

Charles L. Menzemer

INVENTOR

William D. Johnston

BY

Frederick Shapoe

ATTORNEY

United States Patent Office 2,985,700

Patented May 23, 1961

2,985,700

TITANATE THERMOELECTRIC MATERIALS

William D. Johnston, Churchill Borough, Pa., assignor to Westinghouse Electric Corporation, East Pittsburgh, Pa., a corporation of Pennsylvania Filed June 10, 1959, Ser. No. 819,308

7 Claims. (Cl. 136—5)

Figures 1, 2:
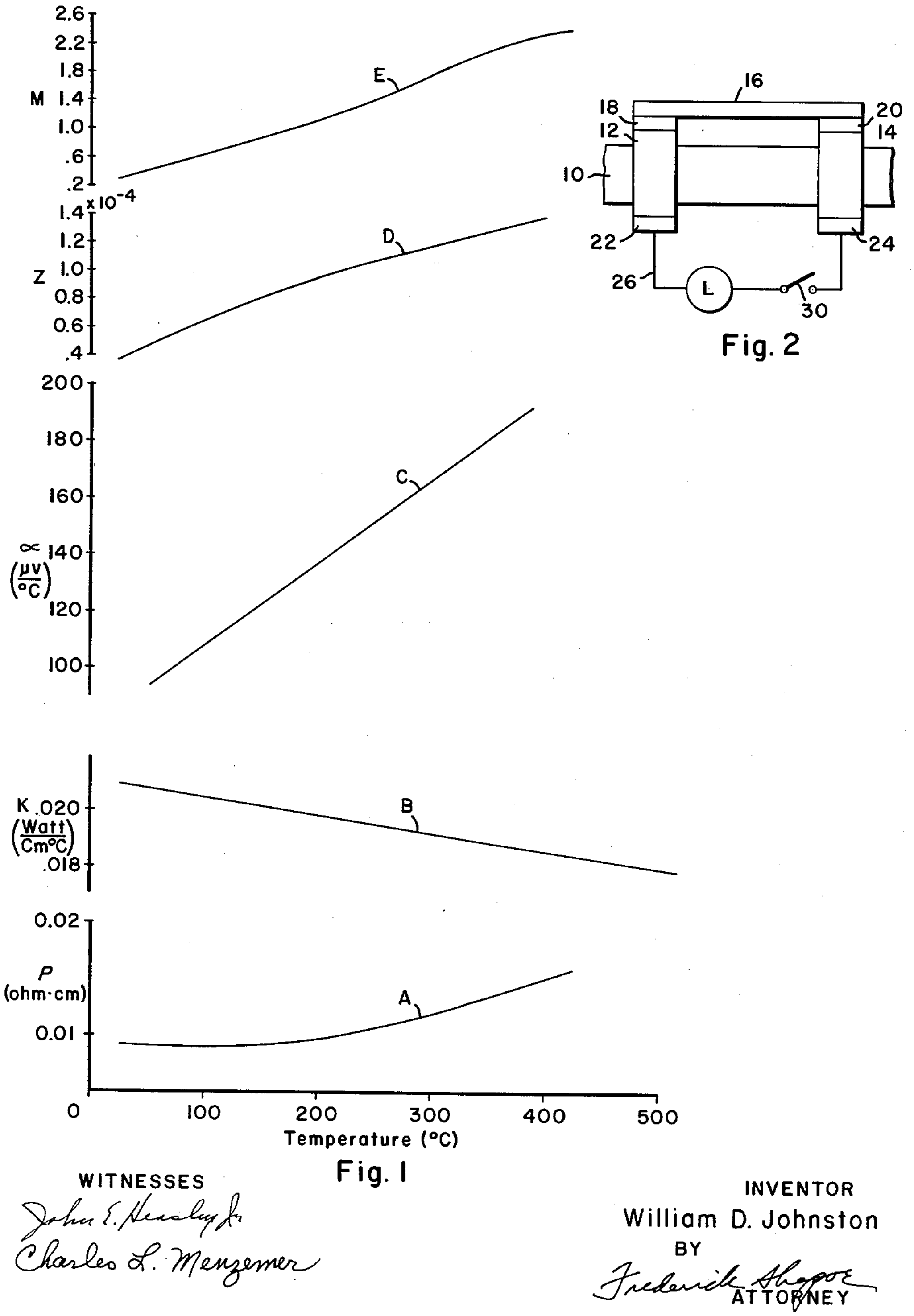

The present invention relates to theromoelements and thermoelectric devices embodying the same.

It has been regarded as highly desirable to produce thermoelectric devices wherein either an electric current is passed therethrough whereby to provide for cooling application, or alternately a source of heat is applied to one junction of theromoelectric device to bring this junction to a given elevated temperature while the other junction is kept at a low temperature, whereby an electrical voltage is generated in the device. For refrigeration applications in particular, one junction of the thermoelectric device is disposed within an insulated chamber and an electrical current is passed through the junction in such a direction that the junction within the chamber becomes cooler while the other junction of the thermoelectric device is disposed externally of the chamber and dissipates heat to a suitable heat sink such as the atmosphere, cooling water or the like.

When heat is applied to one junction of a thermoelectric device while the other junction is cooled, an electrical potential is produced proportional to the thermoelectric power of the thermoelements employed, and to the temperature difference between the junctions. Accordingly, it is desirable that the thermoelements be made of such material that, all other factors being equal, the highest potential is developed for the temperature difference between the hot and cold junctions. The electrical resistivity of the thermoelement member of the devices and the thermal conductivity both should be as low as possible in order to reduce electrical losses and thermal losses.

Thermoelectric devices may be tested and a number indicating its relative effectiveness, called the figure of merit, may be computed from the test data. The higher the figure of merit, the more efficient is the thermoelectric design. The figure of merit, denoted as Z, is defined by:

$$Z=\frac{\alpha^2}{Kp}$$

wherein $\alpha$ is the thermoelectric power (volt/° C.), $p$ is the electrical resistivity (ohm-cm.) and K is the thermal conductivity (watts/cm. ° C.).

In some cases, another criterion often applied to describe the relative merit of a given thermoelectric material is the index of efficiency M. The higher the index of efficiency, the more efficient is the thermoelectric device in converting heat to electrical energy. The index of efficiency, denoted as M, for a thermoelement member may be defined as follows:

$$M=\frac{T\alpha^2}{4Kp}$$

wherein T is the absolute temperature and the other symbols have the meaning set forth above.

An object of the present invention is to provide a thermoelectric power generating device in which the n-type element is comprised of a perovskite titanate compound and is paired up with a p-type element.

Another object of the present invention is to provide a thermoelectric power generating device comprising an n-type member comprised of a material having a formula:

$$A_xB_{1-x}TiO_3$$

wherein A represents at least one element selected from the group consisting of yttrium, lanthanum, cerium, praseodymium, neodymium, promethium, samarium, europium, gadolinium, terbium, dysprosium, holmium, erbium, thulium, ytterbium and lutecium, in the plus 3 valence state, and B represents at least one element selected from the group consisting of calcium, strontium, lead and barium, and x varies from 0.001 to 0.2 and a p-type member electrically connected to one portion of said n-type member.

Other objects will, in part, be obvious and will, in part, appear hereinafter.

For a better understanding of the nature and objects of the invention, reference should be had to the following detailed description and drawings, in which:

Fig. 1 comprises graphs plotting the temperature against various properties of the thermoelectric material; and Fig. 2 is a schematic view, partly in cross section, of a thermoelectric power generating device.

This invention is directed to the preparation and use of certain perovskite titanate compounds suitable for use as thermoelectric element members in a thermoelectric device, and especially to their use as n-type elements in a thermoelectric power generating device.

The titanate compounds having the perovskite crystal structure of this invention have the general formula $$A_xB_{1-x}TiO_3$$

wherein A represents at least one element selected from the group consisting of yttrium, lanthanum, cerium, praseodymium, neodymium, promethium, samarium, europium, gadolinium, terbium, dysprosium, holmium, erbium, thulium, ytterbium, and lutecium, each being in the plus 3 valence state in the compound; and B represents at least one element selected from the group consisting of calcium, strontium, lead and barium, the B element having a plus 2 valence in the compound; and $x$ has a value in the range of from 0.001 to 0.2. If the valence of the A element is other than a plus 3, then the compounds are not particularly satisfactory thermoelectric materials. Particularly satisfactory compounds have been prepared wherein $x$ is from 0.05 to 0.15. Within this latter range of $x$, a particularly satisfactory titanate compound is one in which A represents La and B represents Ba. That is, a compound having the formula:

$$La_xBa_{1-x}TiO_3$$

where $x$ is from 0.05 to 0.15.

Generally, a perovskite titanate thermoelectric material within the scope of this invention and having the formula:

$$A_xB_{1-x}TiO_3$$

wherein A, B and $x$ have the values set forth above, may be prepared from selected oxides, titanates and carbonates in accordance with any of the following equations:

(I)

$$\frac{x}{2}A_2O_3+\frac{x}{2}Ti_2O_3+(1-x)BTiO_3\longrightarrow A_xB_{1-x}TiO_3$$

(II) $$xATiO_3+(1-x)BTiO_3\longrightarrow A_xB_{1-x}TiO_3$$

(III)

$$xTiO_2+\frac{x}{2}A_2O_3+(1-x)BTiO_3\xrightarrow{H_2}A_xB_{1-x}TiO_3+\frac{x}{2}H_2O$$

(IV)

$$\frac{x}{2}A_2Ti_2O_7+(1-x)BTiO_3\xrightarrow{H_2}A_xB_{1-x}TiO_3+\frac{x}{2}H_2O$$

(V)

$$TiO_2+\frac{x}{2}A_2O_3+(1-x)BCO_3\xrightarrow{H_2}A_xB_{1-x}TiO_3+\frac{x}{2}H_2O+(1-x)CO_2$$

in which A, B and $x$ have the meaning set forth hereinabove.

In general, the preparation process set forth in either Equation I or II is preferred over a process of Equations III, IV or V.

When the perovskite titanates are prepared in accordance with either Equation I or II, the following procedure is recommended. The initial reacting materials, in the form of finely divided powders, are weighed out in quantities dependent upon the amount of the final desired product. The finely divided powders are then admixed in a suitable mixer such as a tumbling barrel to a state of homogeneity. The finely divided homogeneous mixture is then pressed into compacts under a pressure of from 10 to 100 p.s.i. or more. The compacts are then charged into a furnace and heated for from 15 minutes to 8 hours at a temperature of from 1350° C. to 1600° C. in an inert or reducing atmosphere. Very satisfactory results have been achieved when the compacts have been heated at 1500° C. for 15 minutes in an argon atmosphere; or at 1450° C. for 8 hours while subjected to a flow of argon. However, in the latter case, the compacts are preferably enclosed in a graphite vessel to prevent oxidation if the vessel is at atmospheric pressure.

In general, when preparing the perovskite titanate compounds of this invention by either Equation I or II, an argon or helium atmosphere is preferred. If the compound is prepared in accordance with Equations III, IV or V, a hydrogen atmosphere is preferred. In either case a sintered pellet having a perovskite crystal structure is produced.

The following example is exemplary of the teachings of this invention.

*Example I*

16.29 grams $La_2O_3$, 7.19 grams $Ti_2O_3$ and 209.90 grams of $BaTiO_3$ in the form of finely divided powders were charged into a mixer and admixed for approximately 1 hour to ensure a homogeneous admixture.

The resultant admixture was then pressed into a series of compacts having a diameter of ½ inch and a height of approximately ½ inch under a pressure of approximately 75 p.s.i.

The compacts were then charged into a furnace and heated at a temperature of approximately 1500° C. for approximately 15 minutes in an argon atmosphere. The heating was by induction, and a graphite susceptor was used to remove any traces of oxygen from the system.

The pellets thus prepared had the formula:

$$La_{.1}Ba_{.9}TiO_3$$

The electrical and thermal properties of the pellets thus prepared were determined at room temperature:

$p$—Electrical resistivity=0.008 ohm-cm.
$K$—Thermal conductivity=0.026 watts/cm. ° C.
$\alpha$—Seebeck coefficient=100.5 $\mu$v./° C. and therefore $M$=.0036=.36%

The electrical and thermoelectric properties of the compound were determined over a range varying from approximately 0 to 500° C. The test data thus obtained are illustrated graphically as the curves A, B, C, D and E in Fig. 1. Curve A is a plot of electrical resistivity, $p$, in ohm-cm. v. temperature; curve B is a plot of thermal conductivity, K, in watts per cm. ° C. v. temperature; and curve C is a plot of Seebeck coefficient, $\alpha$, in microvolts per degree centigrade v. temperature. Curve D is a plot of the figure of merit (Z) v. temperature. The value of Z was determined employing the previously given equation:

$$Z=\frac{\alpha^2}{Kp}$$

Curve E is a graph illustrating the index of efficiency (M) v. temperature. The values of M at the different temperatures were determined using the previously given equation:

$$M=\frac{T}{4}\frac{\alpha^2}{Kp}$$

In a similar manner, lead calcium lanthanum titanate may be prepared by substituting lead titanate and calcium titanate for the barium titanate of Example I, in an amount to provide a total of 0.9 mole of calcium and lead.

Referring to Fig. 2 of the drawing, there is illustrated a thermoelectric device suitable for producing an electrical current from heat. A thermally insulating wall 10 so formed as to provide suitable furnace chamber or other thermal barrier is perforated to permit the passage therethrough of a positive thermoelectric member 12 such as GeTe as disclosed in U.S. patent application Serial No. 787,041, filed January 15, 1959, the assignee of which is the same as in the present invention, and a negative thermoelectric element 14 comprised of a material having the formula:

$$A_xB_{1-x}TiO_3$$

in which A represents at least one element selected from the group consisting of yttrium, lanthanum, cerium, praseodymium, neodymium, promethium, samarium, europium, gadolinium, terbium, dysprosium, holmium, erbium, thulium, ytterbium and lutecium, in the plus 3 valence state, and B represents at least one element selected from the group consisting of calcium, strontium, lead and barium and $x$ varies from 0.001 to 0.2. An electrically conducting strip 16 comprised of a suitable metal, for example, copper, silver or the like is joined to an end face of a member 12 and end face of the member 14 within the chamber so as to provide good electrical and thermal contact therewith. To provide good contacts, the end faces of the members 12 and 14 may be coated with thin layers 18 and 20, respectively, of metal, for example, by vacuum evaporation or by use of ultrasonic brazing whereby good electrical contact is obtained. The metal strip 16 may be brazed or soldered to the metal layers 18 and 20. The metal strip 16 may be provided with suitable fins or other extended surface means (not shown) for conducting heat efficiently thereto from the furnace chamber or other heat source to which it is exposed.

At the end of the member 12 located on the other side of wall 10 is attached a metal plate or strip 22 by brazing or soldering in the same manner as was employed in attaching strip 16 to the other end face. Similarly, a metal strip or plate 24 may be connected to the other end of member 14. The plates 22 and 24 may be provided with heat dissipating fins or other cooling means whereby heat conducted thereto may be dissipated. The surfaces of the plates 22 and 24 may also be cooled by passing a current of fluid such as water across them. An electrical conductor 26 joining a load 28 is electrically connected to the plates 22 and 24. A switch 30 is interposed in the conductor 26 to enable the electrical circuit to be opened and closed as desired. When the switch 30 is moved to the closed position, an electrical current flows between members 12 and 14 and energizes the load 28.

It will be appreciated that a plurality of pairs of the positive and negative members may be joined in series in order to produce a plurality of cooperating thermoelements. In a similar manner, each of the thermoelements will be disposed with one junction in a furnace or exposed to another source of heat while the other junction is cooled by applying water or blowing air thereon or the like. Due to the relative difference in temperature of the junctions, an electrical voltage will be generated in the thermoelements. By joining in series a plurality of the thermoelement, direct current at any suitable voltage will be generated.

It will be appreciated that the above description and drawing is only exemplary and not exhaustive of the invention.

While the invention has been described with reference to particular embodiments and examples, it will be understood that modifications, substitutions and the like may be made therein without departing from the scope.

I claim as my invention:

1. A thermoelectric power generating device comprising at least one pair of joined members, one being an n-type member comprised of a material having the formula:

$$A_xB_{1-x}TiO_3$$

wherein A represents at least one element selected from the group consisting of yttrium, lanthanum, cerium, praseodymium, neodymium, promethium, samarium, europium, gadolinium, terbium, dysprosium, holmium, erbium, thulium, ytterbium and lutecium, in the plus 3 valence state, and B represents at least one element selected from the group consisting of calcium, strontium, lead and barium in the plus 2 valence, and $x$ varies from 0.001 to 0.2, and the other member of the pair being a p-type member electrically connected to one portion of said n-type member.

2. A thermoelectric power generating device comprising an n-type member comprised of a material having a formula:

$$A_xB_{1-x}TiO_3$$

wherein A represents at least one element selected from the group consisting of yttrium, lanthanum, cerium, praseodymium, neodymium, promithium, samarium, europium, gadolinium, terbium, dysprosium, holmium, erbium, thulium, ytterbium and lutecium in the plus 3 valance state, and B represents at least one element selected from the group consisting of calcium, strontium, lead and barium, and $x$ varies from 0.05 to 0.15.

3. A thermoelectric power generating device comprising an n-type member comprised of a material having the formula:

$$La_xB_{1-x}TiO_3$$

wherein B represents at least one element selected from the group consisting of calcium, strontium, lead and barium in the plus 2 valence state, and $x$ varies from 0.001 to 0.2.

4. A thermoelectric power generating device comprising an n-type member comprised of a material having a formula:

$$LaB_{1-x}TiO_3$$

wherein B represents at least one element selected from the group consisting of calcium, strontium, lead and barium in the plus 2 valence state and $x$ varies from 0.05 to 0.15, and a p-type member electrically connected to one portion of said n-type member.

5. A thermoelectric power generating device comprising an n-type member comprised of a material having the formula:

$$La_xBa_{1-x}TiO_3$$

wherein $x$ varies from 0.001 to 0.2, and a p-type member electrically connected to one portion of said n-type member.

6. A thermoelectric power generating device comprising an n-type member having a formula:

$$La_xBa_{1-x}TiO_3$$

wherein $x$ varies from 0.05 to 0.15, and a p-type member electrically connected to one portion of said n-type member.

7. A thermoelectric power generating device comprising an n-type member comprised of a material having the formula:

$$La_{0.1}Ba_{0.9}TiO_3$$

and a p-type member electrically connected to one portion of said n-type member.

References Cited in the file of this patent

UNITED STATES PATENTS 2,753,522 Marsden ---------------- July 3, 1956

FOREIGN PATENTS 577,109 Great Britain ----------- May 6, 1946
574,577 Great Britain ----------- Jan. 14, 1946